(12) United States Patent
Kim et al.

(10) Patent No.: US 10,439,165 B2
(45) Date of Patent: Oct. 8, 2019

(54) ORGANIC LIGHT EMITTING DIODE DISPLAY

(71) Applicant: LG Display Co., Ltd., Seoul (KR)

(72) Inventors: JinHwan Kim, Paju-si (KR); WooChan Kim, Goyang-si (KR); Hyunchul Um, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 67 days.

(21) Appl. No.: 15/499,759

(22) Filed: Apr. 27, 2017

(65) Prior Publication Data

US 2018/0033998 A1   Feb. 1, 2018

(30) Foreign Application Priority Data

Jul. 29, 2016 (KR) .................. 10-2016-0097214
Oct. 31, 2016 (KR) .................. 10-2016-0143250

(51) Int. Cl.
  *H01L 51/52*   (2006.01)
  *H01L 27/32*   (2006.01)
(52) U.S. Cl.
  CPC ........ *H01L 51/525* (2013.01); *H01L 27/3246* (2013.01); *H01L 27/3258* (2013.01); *H01L 51/5253* (2013.01)

(58) Field of Classification Search
  None
  See application file for complete search history.

(56) References Cited

U.S. PATENT DOCUMENTS

2015/0228927 A1   8/2015   Kim
2016/0204373 A1   7/2016   Park

OTHER PUBLICATIONS

Extended European Search Report for European Patent Application No. EP 17170174.1, Nov. 7, 2017, 7 Pages.
The State Intellectual Property Office of the People's Republic of China, First Office Action, CN Patent Application No. 201710357774.3, Nov. 1, 2018, 25 pages.
State Intellectual Property Office of People's Republic of China, Second Office Action, CN Patent Application No. 201710357774.3, May 21, 2019, 17 pages.

*Primary Examiner* — Raj R Gupta
(74) *Attorney, Agent, or Firm* — Fenwick & West LLP

(57) ABSTRACT

An organic light emitting diode display is disclosed in which a flow control pattern of an organic protective layer is disposed to implement a thin bezel. In an active area and a bezel area defined on a substrate, the flow control pattern disposed reduces the flow of a protective layer so as to minimize area size of the bezel area.

18 Claims, 11 Drawing Sheets

ORGANIC LIGHT EMITTING DIODE DISPLAY

CROSS-REFERENCE TO RELATED APPLICATIONS

This application claims the priority of Korean Patent Application No. 10-2016-0097214 filed on Jul. 29, 2016 and Korean Patent Application No. 10-2016-0143250 filed on Oct. 31, 2016 in the Korean Intellectual Property Office, each of which is hereby incorporated by reference in its entirety.

BACKGROUND

Field

The present disclosure relates to an organic light emitting diode display and more particularly, to an organic light emitting diode display including a flow control pattern configured to more efficiently control a flow of an adhesive layer disposed on an organic light emitting element or a protective layer made of an organic material.

Description of the Related Art

Recent display devices which can display various information and interact with a user who views the corresponding information have various sizes, various shapes, and various functions.

The display devices include a liquid crystal display device (LCD), a plasma display panel (PDP), an electrophoretic display device (FPD), and an organic light emitting element display device (OLED).

The liquid crystal display device (LCD) is driven by using optical anisotropy and a polarization property of liquid crystal. Since the structure of the liquid crystal is thin and long, the arrangement of molecules has directivity and an electric field is artificially applied to the liquid crystals to control the direction of the molecule arrangement. Therefore, when the molecule arrangement direction of the liquid crystals is arbitrarily controlled, the molecule arrangement of the liquid crystals is changed and light is refracted in the molecule arrangement direction of the liquid crystals by the optical anisotropy, and as a result, the light is transmitted.

Pixels are driven by the light transmitted by changing the molecule arrangement direction of the liquid crystal corresponding to a plurality of pixels by such a property to display image information in the display device. As described above, the LCD requires an additional light source such as backlight.

However, since the OLED as a self-luminous display device does not require the additional light source unlike the LCD, the OLED can be manufactured to be light and thin. Further, the OLED is driven with low voltage to be advantageous in terms of power consumption and excellent even in color expression, response speed, viewing angle, and contrast ratio (CR), and thus the OLED display has been under research as a next-generation display.

The OLED display uses an organic material as an organic light emitting layer, and electrons and holes are injected into the organic light emitting layer configured by the organic material through two electrodes, and as a result, excitons are formed while the electrons and the holes meet on the organic light emitting layer and are recoupled to each other and the organic light emitting layer emits the light due to energy from the excitons.

The electrons and the holes are injected through an anode electrode which is a pixel electrode and a cathode electrode which is a common electrode and a driving element for controlling current injected into the pixel electrode is disposed. Further, in order to more smoothly inject the electrons and the holes, the organic light emitting layer may include a hole injection layer, a light emitting layer, a hole transport layer, an electron transport layer, and an electron injection layer and may be a multi-layer structure.

The OLED displays information on a screen by emitting light. A plurality of pixels including an organic light emitting element having the organic light emitting layer and may be divided into an active matrix type organic light emitting element display (AMOLED) or a passive matrix type organic light emitting element display (PMOLED) according to a scheme to drive the pixel.

The AMOLED displays an image by controlling current which flows on an organic light emitting diode by using a thin film transistor (alternatively, "TFT").

The AMOLED may include various thin film transistors and includes a switching thin film transistor, a driving TFT connected with the switching TFT, and an organic light emitting diode (OLED) connected to the driving TFT.

The switching TFT is formed at a portion where a scan line and a data line cross each other. The switching TFT serves to select the pixel. The switching TFT includes a gate electrode (gate line), a semiconductor layer, a source electrode (source line), and a drain electrode (drain line) branched from the scan line. In addition, the driving TFT serves to drive the organic light emitting element by supplying the current to the OLED (an organic light emitting element) of the pixel selected by the switching TFT. The driving TFT includes the gate electrode connected with the drain electrode of the switching TFT, the semiconductor layer, the source electrode connected to a driving current line, and the drain electrode. The drain electrode of the driving TFT is connected with the anode electrode of the organic light emitting diode (OLED).

As described above, the source electrode, the drain electrode, and the semiconductor layer constituting a plurality of TFTs having various purposes, and numerous electrodes lines connected therewith are disposed and a planarization layer exists on an electrode layer.

The planarization layer may be constituted by one layer or a plurality of layers, and a pixel structure becomes complicated and a multi-layer planarization layer may be used for efficiently disposing a complicated electrode in order to implement a high-resolution and high-performance OLED.

The anode electrode which is the pixel electrode is disposed on the planarization layer, and the organic light emitting layer and the common electrode are respectively disposed on the anode electrode. When the anode electrode is considered the pixel electrode, and the organic light emitting layer and the common electrode are disposed on the organic light emitting layer, particles may be generated, and as a result, a protective layer made of the organic material may be disposed in order to suppress damage to the organic light emitting element.

The protective layer serves to minimize or suppress penetration of oxygen and moisture to the organic light emitting element. An adhesive layer and a barrier film may be disposed on the protective layer and the organic light emitting element may further include a plurality of encapsulation layers.

The aforementioned protective layer may be disposed on the organic light emitting element by using a photocurable material which may be cured when using light of UV and the like, and when the top of the protective layer is planarized, various techniques for disposing the protective layer in a desired area have been used.

SUMMARY

While a protective layer is disposed on the organic light emitting element to minimize damage by particles and the like while sealing an organic light emitting element and a plurality of dams is disposed in a non-display area of the organic light emitting diode display to control the flow of the protective layer, the flow of the protective layer is controlled. However, there may be a limit to control the flow by a dam structure in the non-display area and there is a constraint condition to consider process errors and the like.

Such a constraint condition has a limit to implement the organic light emitting diode display having a slim bezel area by minimizing the non-display area of the organic light emitting diode display, and when the upper surface of the protective layer is curved, transmission degrees of the protective layer in the edge area and the center of the organic light emitting diode display may be different from each other, and thus there is a problem in that the display quality is lowered.

Therefore, a new structure of the organic light emitting diode display is disclosed. The organic light emitting diode display is capable of minimizing a width of the non-display area by more efficiently controlling a flow of a protective layer formation material when forming the protective layer included in the organic light emitting diode display. Further, a new structure of the organic light emitting diode display is disclosed. The organic light emitting diode display is capable of improving display quality by minimizing a curve of the upper surface of the protective layer while controlling the flow of the protective layer.

An object to be achieved by the present disclosure is to an organic light emitting diode display capable of controlling a flow of a protective layer by disposing a flow control pattern at the outer portion of an active area to control the flow of the protective layer.

The objects of the present disclosure are not limited to the aforementioned objects, and other objects, which are not mentioned above, will be apparent to a person having ordinary skill in the art from the following description.

According to an aspect of the present disclosure, there is provided an organic light emitting diode display comprising: a substrate including an active area that displays an image and a bezel area that does not display the image; an organic light emitting element over the substrate; a protective layer over the substrate that protects the organic light emitting element, the protective layer made of a curable organic material; a planarization layer below the protective layer and the organic light emitting element, the planarization layer including a concave portion that controls a flow of the protective layer in a non-cured state from the active area into the bezel area during a manufacturing process of disposing the protective layer over the substrate.

According to another aspect of the present disclosure, there is provided an organic light emitting diode display, comprising: a substrate including an active area that displays an image and a bezel area that does not display an image; an organic light emitting element over the substrate; a protective layer over the substrate that covers the organic light emitting element; a plurality of planarization layers below the organic light emitting element; a bank on the second planarization layer; a flow control pattern on the second planarization layer and adjacent to the bank, the flow control pattern comprising at least one concave portion that controls a flow of the protective layer from the active area into the bezel area.

According to another aspect of the present disclosure, there is provided an organic light emitting diode display, comprising: a substrate including an active area that displays an image and a bezel area that does not display the image, the bezel area adjacent to the active area; a plurality of driving elements on the substrate; a plurality of planarization layers covering the plurality of driving elements, the plurality of planarization layers including a first planarization layer and a second planarization layer on the first planarization layer; a bank layer on the second planarization layer; an organic light emitting element including an organic light emitting layer on the bank layer; and a protective layer covering the organic light emitting element, wherein at least one of the plurality of planarization layers and the bank layer includes a flow control pattern having a plurality of concave portions that control a flow of the protective layer from the active area into the bezel area during a manufacturing process of the organic light emitting diode display.

According to another aspect of the present disclosure, there is provided an organic light emitting diode display, comprising: a substrate including an active area that displays an image and a bezel area that does not display the image; an organic light emitting element over the substrate; and a protective layer over the substrate that protects the organic light emitting element, the protective layer sloping downward from the active area towards the bezel area.

The effects of the present disclosure are not limited to the aforementioned effects, and other effects, which are not mentioned above, will be apparent to a person having ordinary skill in the art from the following description.

Since required features of claims are not specified by the contents of the present disclosure disclosed in the technical objects, technical solutions, and effects described above, the scope of claims is not limited to the details disclosed in the contents of the present disclosure.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
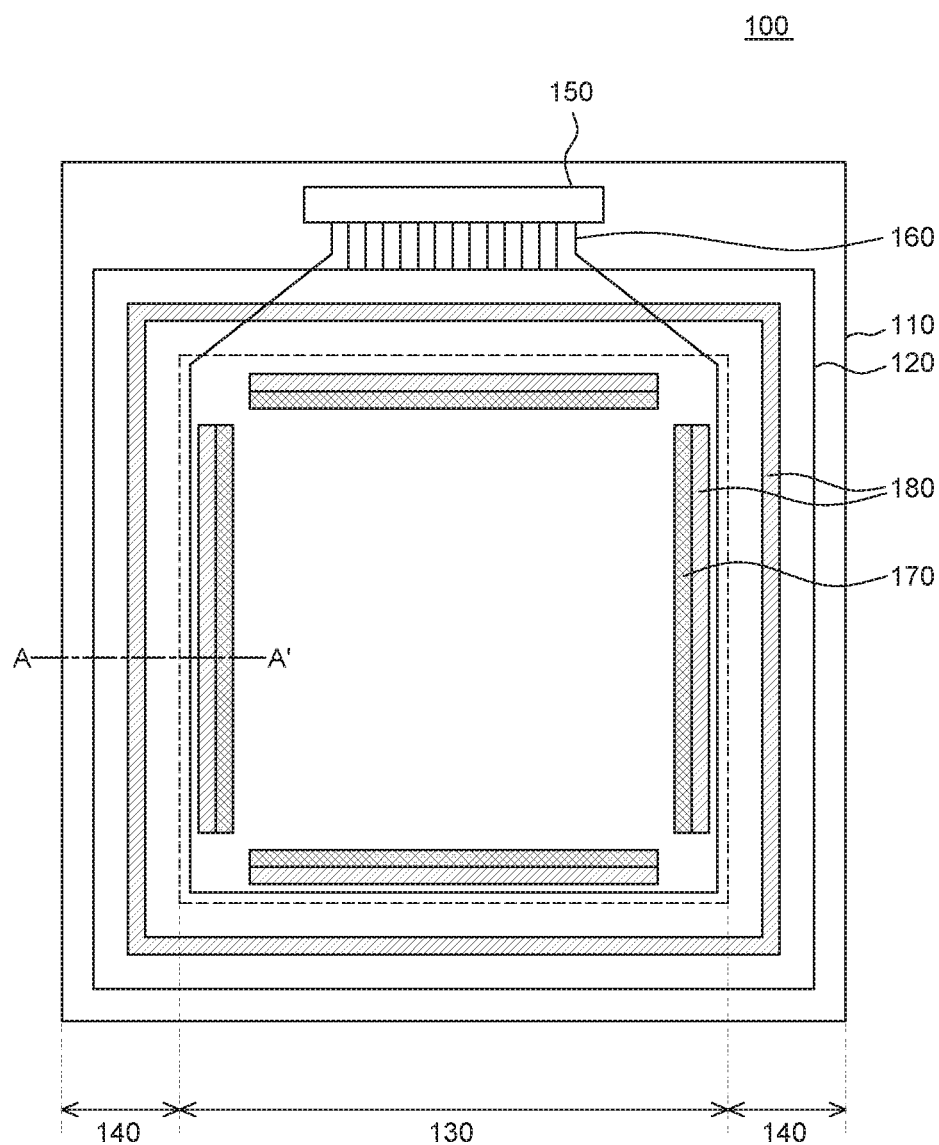
FIG. 1 is a schematic plan view for describing an organic light emitting diode display with a flow control pattern according to an exemplary embodiment of the present disclosure.

Advantages and features of the present disclosure, and methods for accomplishing the same will be more clearly understood from exemplary embodiments described below with reference to the accompanying drawings. However, the present disclosure is not limited to the following exemplary embodiments but may be implemented in various different forms. The exemplary embodiments are provided only to complete disclosure of the present disclosure and to fully provide a person having ordinary skill in the art to which the present disclosure pertains with the category of the disclosure, and the present disclosure will be defined by the appended claims.

The shapes, sizes, ratios, angles, numbers, and the like illustrated in the accompanying drawings for describing the embodiments of the present disclosure are merely examples, and the present disclosure is not limited thereto. Like reference numerals generally denote like elements throughout the present specification. Further, in the following description, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

Although the terms "first", "second", and the like are used for describing various components, these components are not confined by these terms. These terms are merely used for distinguishing one component from the other components. Therefore, a first component to be mentioned below may be a second component in a technical concept of the present disclosure.

The features of various embodiments of the present disclosure can be partially or entirely bonded to or combined with each other and can be interlocked and operated in technically various ways, and the embodiments can be carried out independently of or in association with each other.

Hereinafter, various configurations of an organic light emitting diode display having a thin bezel by controlling efficiently flow of an organic protective layer according to an exemplary embodiment of the present disclosure will be described.

Hereinafter, various exemplary embodiments of the present disclosure will be described in detail with reference to the accompanying drawings.

FIG. 1 is a schematic plan view for describing an organic light emitting diode display with a flow control pattern according to an exemplary embodiment of the present disclosure.

Referring to FIG. 1, an organic light emitting diode display 100 includes a substrate 110 defined an active area 130 and a bezel area 140, a barrier film 120 protecting an organic light emitting element, a drive integrated circuit (IC) 150, a wiring electrode 160, a flow control pattern 170, and a dam structure 180.

In the substrate 110, the active area 130 and the bezel area 140 are defined. The active area 130 comprises a plurality of pixels including an organic light emitting elements (not illustrated). The bezel area 140 is disposed at a peripheral portion of the active area 130, that is, an outer side of the active area 130. Particularly, the bezel area 140 may be disposed such that the bezel area 140 surrounds the active area 130.

Further, the substrate 110 includes a plurality of thin film transistors for supplying signals and currents for driving the plurality of pixels. The thin film transistors include a switching thin film transistor and a driving thin film transistor connected to the switching thin film transistor and the organic light emitting element.

The thin film transistors (the switching thin film transistor and the driving thin film transistor) are connected to a gate line and a data line which are disposed on the substrate 110, and the switching thin film transistor functions to select the pixel and is disposed at or near crossing portions of the gate line and the data line. The switching thin film transistor includes a gate electrode, a semiconductor layer, a source electrode, and a drain electrode.

The driving thin film transistor serves to drive an anode electrode of the pixel selected by the switching thin film transistor. The driving thin film transistor includes a gate electrode and a semiconductor layer connected with the drain electrode of the switching thin film transistor, a source electrode connected to a driving current line, and a drain electrode. The drain electrode of the driving thin film transistor is connected with an anode electrode which is a pixel electrode of the organic light emitting element.

The organic light emitting element is vulnerable to oxygen and moisture. Defects are generated by penetration of the oxygen and the moisture into the organic light emitting element and thus the organic light emitting element needs to be covered by a multilayered protective layer or film.

A barrier film 120 is bonded to the substrate 110 to cover the organic light emitting elements, and the barrier film 120 and the substrate 110 may be adhered together by an adhesive layer.

On the substrate 110, a protective layer is disposed to protect an organic light emitting layer included in the organic light emitting element. The protective layer is made of an organic material having high flow characteristic, and since a formation material of the protective layer is made of an organic material having lower viscosity than that of the related art, dispersing the formation material of the protective layer from the active area 130 to the bezel area 140 needs to be minimized by controlling the flow of the formation material of the protective layer. To this end, in the exemplary embodiment of the present disclosure, at least one dam structure 180 and a flow control pattern 170 may be disposed on the substrate 110.

The flow control pattern 170 may include a buffer space for controlling the flow of the formation material of the protective layer, and the dam structure may be hydrophobically-treated to further control the flow of the protective layer. This is possible by controlling the surface energy and when the dam structure is coated or ion-treated with a material such as carbon (C) or hydrogen (H), which is capable of enhancing the surface energy, the surface energy of the dam structure 180 may be controlled, and as a result, the dam structure is hydrophobically-treated to further control the flow of the protective layer.

Figure 2A:
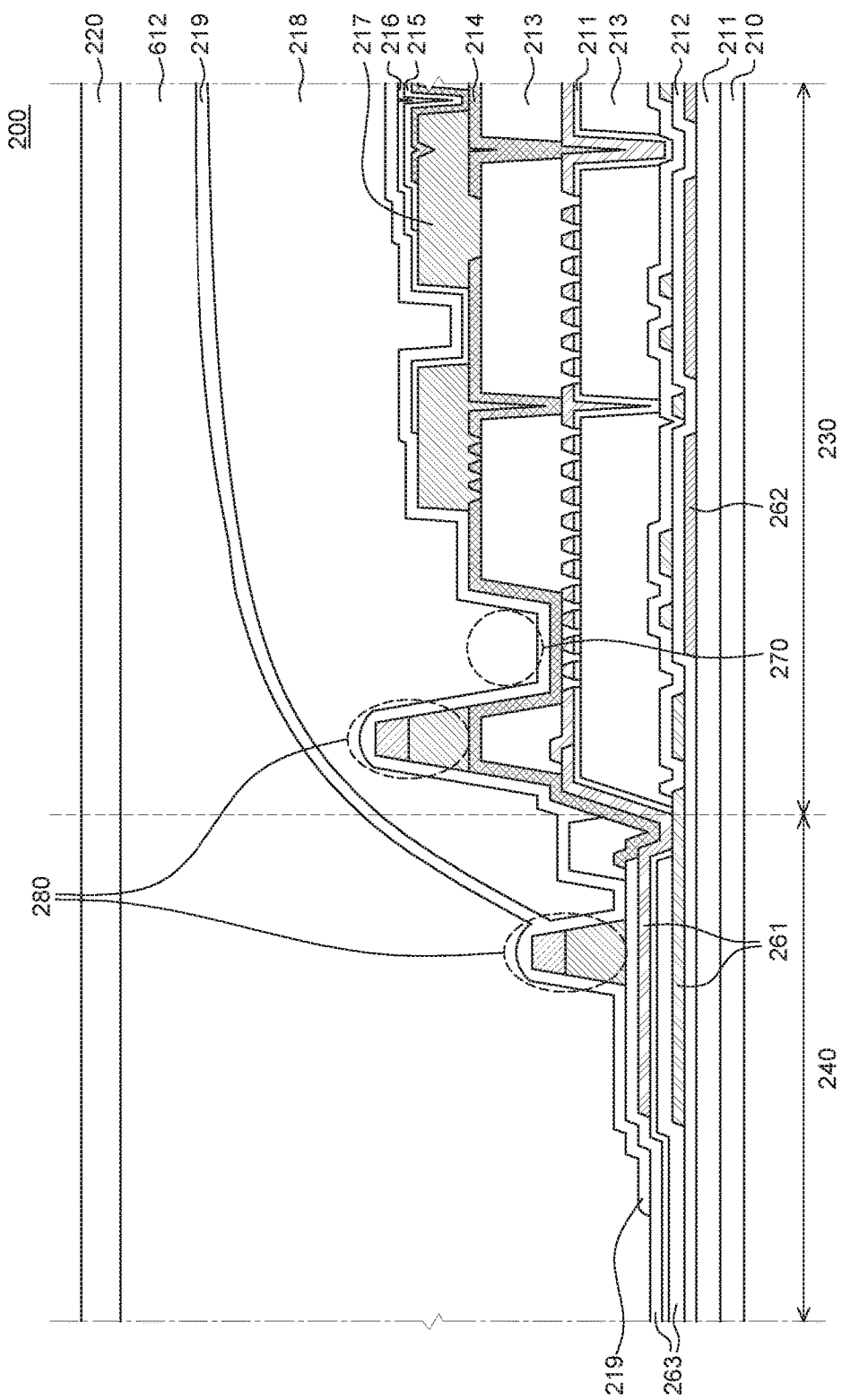
FIGS. 2A to 2C are schematic cross-sectional views for describing various configurations of a flow control pattern and a dam structure according to the exemplary embodiment of the present disclosure.
Figure 2B:
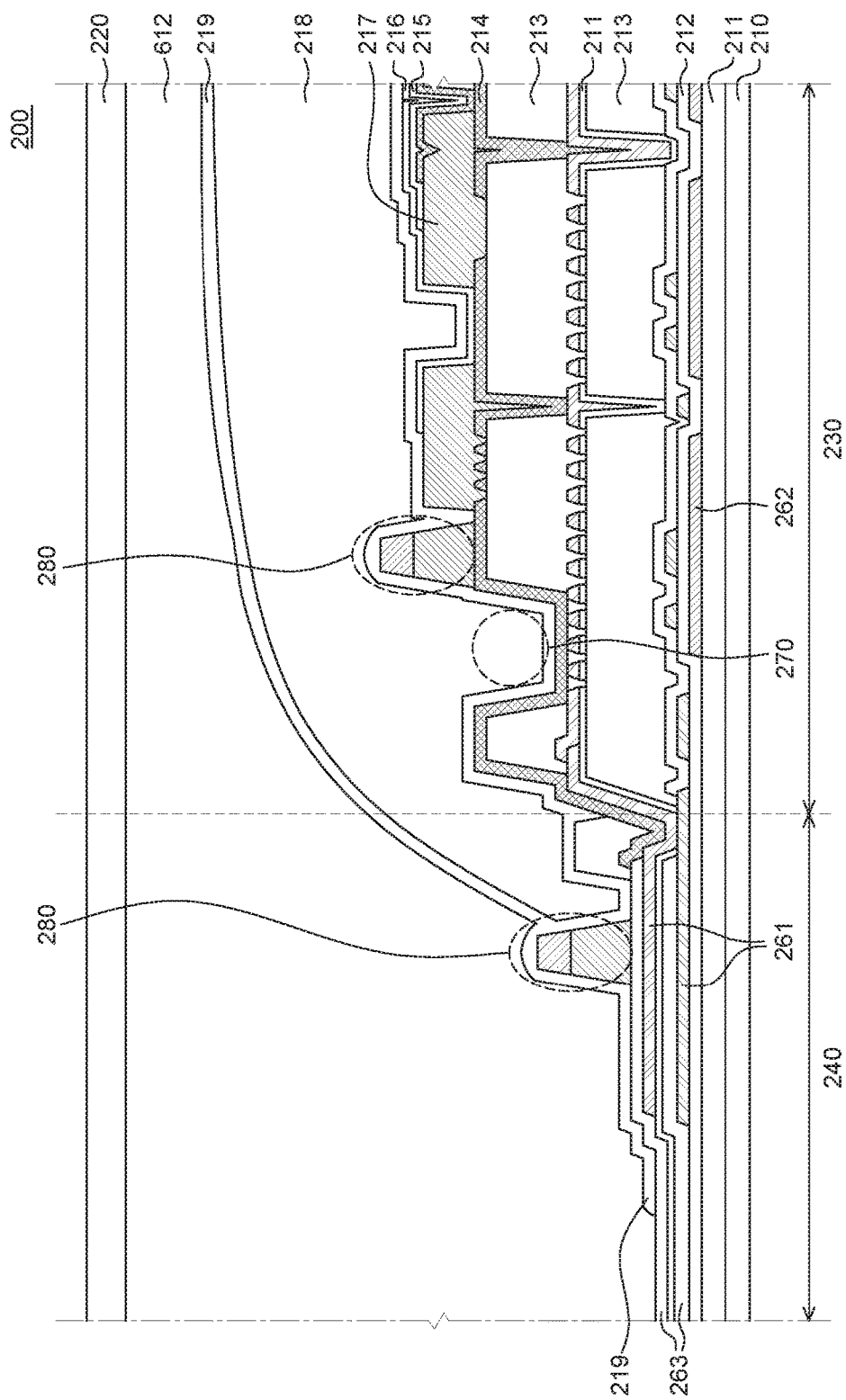
Figure 2C:
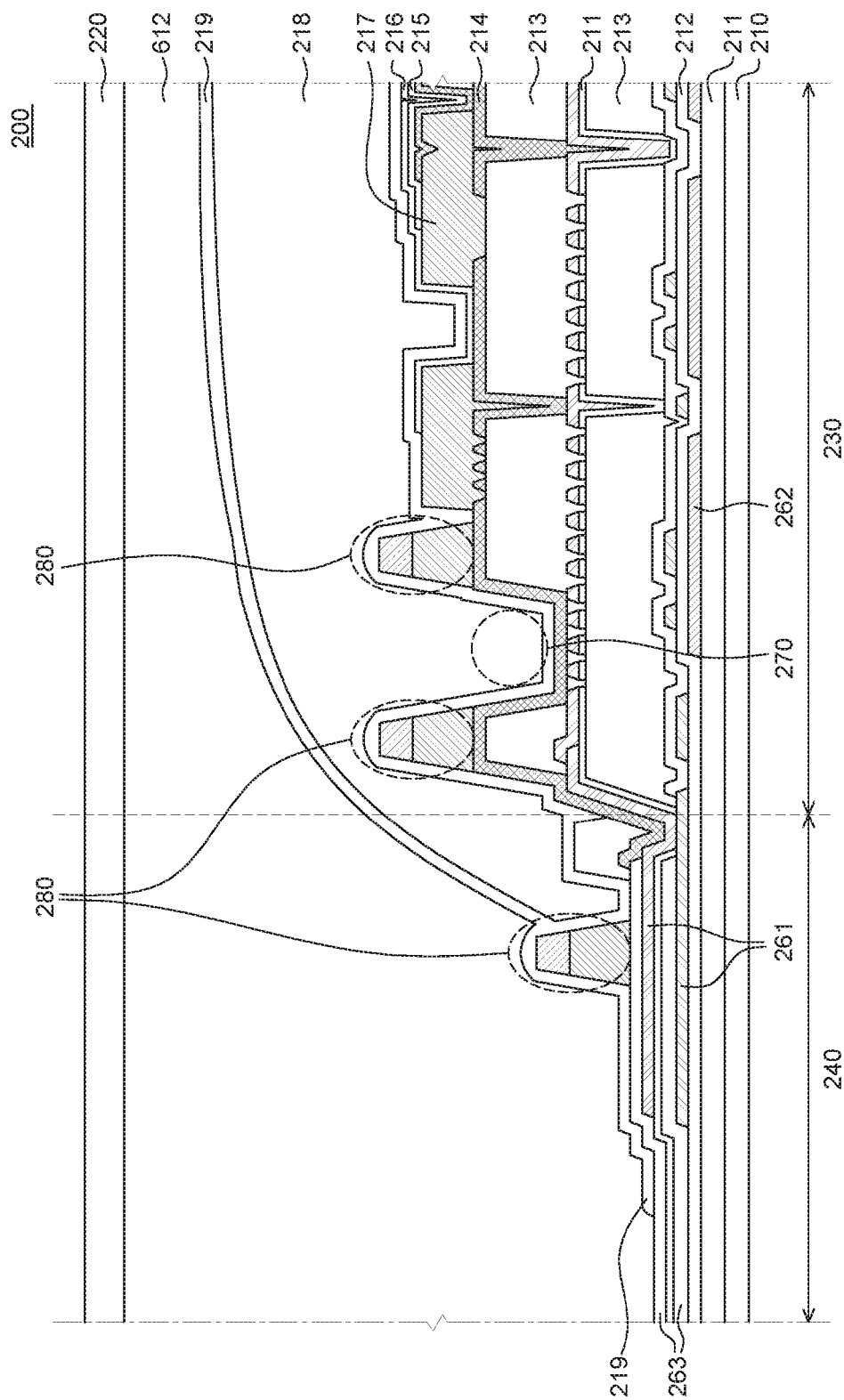

FIGS. 2A to 2C are cross-sectional views for describing various configurations of the flow control pattern and the dam structure according to the exemplary embodiment of the present disclosure, as schematic cross-sectional views taken along line A-A' of FIG. 1.

Referring to FIG. 2A, when a planarization layer 213 and a protective layer 218 are disposed on a substrate 210, a flow control pattern 270 that controls the flow of the protective layer 218 is disposed on the planarization layer 213 to control the protective layer 218 to be dispersed to a bezel area 240.

The substrate 210 may be a plastic (e.g. polyimide-based) substrate that is flexible, and in this case, a buffer layer 211 for minimizing penetration of oxygen and moisture from the lower portion of the substrate 210 may be disposed on the substrate 210. A gate electrode 262 for turning on/off the thin film transistor is disposed on the buffer layer 211. The gate electrode 262 may be a multilayered metal line, such as a metal line including aluminum (Al) or molybdenum (Mo).

An inter-layer dielectric (ILD) layer 212 and a source/drain electrode 261 are disposed on the gate electrode 262. The ILD layer 212 may be disposed to suppress conduction between the gate electrode 262 and the source/drain electrode 261 and suppress contamination or damage by the lower portion of the gate electrode 262 and may be an inorganic layer having a 2-layer structure including silicon nitride (SiNx) and silicon dioxide ($SiO_2$). When using a silicon dioxide ($SiO_2$) single layer, there are advantages with respect to moisture penetration protection and manufacturing process time, but undesirable parasite capacitance affects the thin film transistors on the substrate. On the other hand, use of a single SiNx layer leads to minimal formation of parasitic capacitance, but moisture penetration protection is not optimal and film formation is difficult. Thus, in order to exploit the advantages of both $SiO_2$ and SiNx, the ILD layer 212 may be formed as a 2-layer structure including both materials.

A passivation layer 263 may be disposed on the source/drain electrode 261. The passivation layer 263 protects the source/drain electrode 261 and may be made of an inorganic layer for suppressing electrical conduction between the electrode layers which may be disposed at the top and for suppressing contamination or damage to the upper layer. Alternatively, since the thin film transistor including the source/drain electrode 261 has a large amount of metal material and high electrical reactivity, a double-layer structure of organic and inorganic layers may be used as the passivation layer 263.

The planarization layer 213 may be disposed on the passivation layer 263. The planarization layer 213 can alleviate (or planarize) steps (or other surface irregularities) formed by various layer patterns, and may be made of a polymer-based material including at least one among an acrylic-based resin, an epoxy-based resin, and polyimide.

The planarization layer 213 may be a single layer, or have two or more layers by considering the displacement of the wiring electrode or other structural characteristics.

If the planarization layer 213 has two layers, a metal electrode may be disposed between such two layers. The planarization layer 213 may include a dielectric material that exhibits dielectric characteristics to create the desired capacitance. Furthermore, if a plurality of planarization layers 213 are employed, various capacitance characteristics can be achieved depending upon the desired performance requirements.

In the case where the planarization layer 213 is disposed as two layers, as illustrated in FIG. 2A, the buffer layer 211 and the passivation layer 263 may be further included between the plurality of planarization layers 213. The buffer layer 211 and the passivation layer 263 between the plurality of planarization layers 213 may include a plurality of holes or openings to discharge gases (i.e. performing so-called "out-gassing") that may be generated from the planarization layers 213, as illustrated in FIG. 2A.

Such gases generated from the planarization layers 213 can be detrimental to an active layer and other parts of the thin film transistor, resulting in changes in a driving voltage and other characteristics of the thin film transistor. If such gases penetrate into the organic light emitting layer 215, defects such as dark spots, which are visible on the screen, and the like may Occur.

On the planarization layers 213, an anode electrode 214 (which acts as a pixel electrode) is disposed and thereafter, the organic light emitting layer 215 and a cathode electrode 216 (which acts as a common electrode) are disposed.

When the organic light emitting diode display 200 is a top emission type, the anode electrode 214 may be disposed by using an opaque metal material as a reflective electrode that reflects light. Further, in the top emission type organic light emitting diode display 200, the cathode electrode 216 may be disposed of a transparent conductive material such as ITO or IZO.

On the planarization layer 213, a bank layer capable of partitioning a plurality of pixels and/or sub-pixels is disposed. Such bank layer 217 may include black color dye so as to minimize a light blurring phenomenon and to suppress color mixing with respect to various viewing angles.

The planarization layer 213 can be disposed in the active area 230 of the organic light emitting diode display 200 so that the aforementioned electrodes having various purposes and the organic light emitting element may be disposed.

In the bezel area 240, a wiring electrode and the like that transfer driving signals and currents for driving the plurality of pixels may be disposed, and a plurality of source/drain electrodes 261 is disposed in a plurality of layers by using the aforementioned passivation layer 263, buffer layer 211, and ILD layer 212 to minimize an area of the bezel area 240.

On the cathode electrode 216, an encapsulation layer, which can be formed of a repeated laminate structure of organic and inorganic materials, may be disposed to protect the organic light emitting layer 215 from oxygen and moisture. The encapsulation layer may be configured by a protective layer 218 made of an organic material and an inorganic layer 219 made of an inorganic material. Particularly, the protective layer 218 serves to protect the organic light emitting element from contamination by covering debris or particles that may be generated in the process of manufacturing the organic light emitting diode display 200. The protective layer 218 may be disposed by using an inkjet process and the like and can be made of an optical or thermal curable material that is cured by heat or light. The dam structure 280 may be disposed in the bezel area 240. A plurality of dam structures 280 may be employed, and can be disposed to surround the active area 230. Alternatively or additionally, one or more dam structures may be disposed partially or completely in the active area 230.

The dam structures 280 may have a plurality of layers by using at least one or more materials and for example, may be disposed by using the same or different materials used in creating the bank layer 217 and a spacer.

The dam structures 280 may be disposed to surround the active area 230 so as to control the flow of the protective layer 218 during a manufacturing process.

The protective layer 218 is coated initially as a liquid having high density and if the material of the dam structure has hydrophobic characteristics, the protective layer 218 may run up or extend onto the edges of the dam structure 280. That is, the coated surface of the protective layer 218 is not properly planarized and a height at an edge portion adjacent to the dam structure 280 may be undesirably larger than that of the central portion.

In this case, when the barrier film 220 and the inorganic layer 219 of the encapsulation layer are adhered to each other by using an adhesive layer 612, the protective layer 218 may overflow to the bezel area 240 and in this case, oxygen and moisture may penetrate through the side of the protective layer 218.

In order to suppress this problem, the bezel area 240 can be designed to have an area or margin to accommodate such overflow.

To achieve this, a flow control pattern 270 is disposed on the planarization layer 213 to further control the flow of the protective layer 218. Since the planarization layer 213 may have at least one or more layers, the flow control pattern 270 can be achieved by opening a part of the uppermost portion of the planarization layer 213 to ensure a buffer space in consideration of a deviation for a coating amount of the protective layer 218 and minimize a design margin for the bezel area 240. As a result, when compared to the conventional art, it is possible to provide the organic light emitting diode display 200 having a long lifespan and high reliability while having a narrow bezel.

If disposed at the outer portion of the flow control pattern 270, the dam structure 280 may suppress the formation material of the protective material 218 from further flowing to the bezel area 240. Furthermore, when the dam structure 280 has hydrophilicity or hydrophobicity, due to surface treatment upon controlling the surface energy of the dam structure 280 by a method such as ion treatment, the protective layer 218 can be planarized by controlling a contact areas formed between the flow control pattern 270, the side of the dam structure 280, and the protective layer 218.

Meanwhile, the inner side of the flow control pattern 270 may be covered by the pixel electrode. The cathode electrode 216 serves as a negative electrode and a common electrode and is electrically connected by using the anode electrode 214 to be connected with abase line disposed in the bezel area 240. In this case, the inner surface of the flow control pattern 270 may be covered by the anode electrode 214.

Since the flow control pattern 270 can be damaged in its manufacturing process, the anode electrode 214 should cover at least a portion of the inner surface of the flow control pattern 270 to prevent any damage to such flow control pattern 270.

Subsequently, referring to FIGS. 2B and 2C, various configurations that control the flow of the protective layer 218 by the flow control pattern 270 and the dam structure 280 will be described, and any description of duplicated or substantially equal configurations will be omitted.

Referring to FIG. 2B, the flow control pattern 270 is disposed at the outmost portion in the active area 230 and the dam structure 280 is disposed inside the active area 230 to be adjacent to the organic light emitting element as compared with the flow control pattern 270.

As such, in the organic light emitting diode display 200 according to the exemplary embodiment of the present disclosure, the flow of the protective layer 218 may be controlled by the dam structure 280 and the flow control pattern 270. As a result, in the exemplary embodiment of the present disclosure, the flow of the protective layer 218 may be primarily controlled by the dam structure 280 adjacent to the flow control pattern 270 disposed inside the active area 230, and any overflow of the protective layer 218 beyond the dam structure 280 in the active area 230 may be handled by the buffer space of the flow control pattern 270. In other words, any overflow of the protective layer 218 material is secondarily blocked from going towards the bezel area 240 to thus further minimize the flow of the protective layer 218 material into the bezel area 240.

Referring to FIG. 2C, the dam structures 280 may be disposed at both sides of the flow control pattern 270 and an amount of the formation material of the protective layer 218 which may be received in the flow control pattern 270 may be increased depending upon how the dam structures 280 are configured. Further, the upper surface of the protective layer 218 may planarized by the plurality of dam structures 280. In other words, the particular characteristics of the dam structures 280 and/or the flow control pattern 270 (e.g., height, width, surface treatment, spacing, depth, etc.) can be configured in variety of ways depending upon the characteristics of the protective layer 218 (e.g., thickness, surface area, material viscosity, etc.), the overall size of the display panel (e.g., relatively small, medium or large), other characteristics of the display panel (e.g., glass substrate, plastic substrate, foldable or bendable form-factor, etc.), the end product having the display panel implemented therein (e.g., mobile electronics, view monitors, large-screen TVs, etc.), the environment in which the end product is to be used (e.g., hand-held user mobile applications, office setting, automobile or vehicle implementation, etc.), and the like.

Next, an organic light emitting diode display 300 according to another exemplary embodiment of the present disclosure will be described. For reference, before describing the organic light emitting diode display according to another exemplary embodiment of the present disclosure, it should be noted that FIGS. 3A to 3C are diagrams that more schematically illustrate some details of FIGS. 2A to 2C described above, whereby the inorganic layers 217 and 219 of the encapsulation layer are omitted and only the protective layer is shown, and the lower configurations of the encapsulation layer are shown in more detail.

Figure 3A:
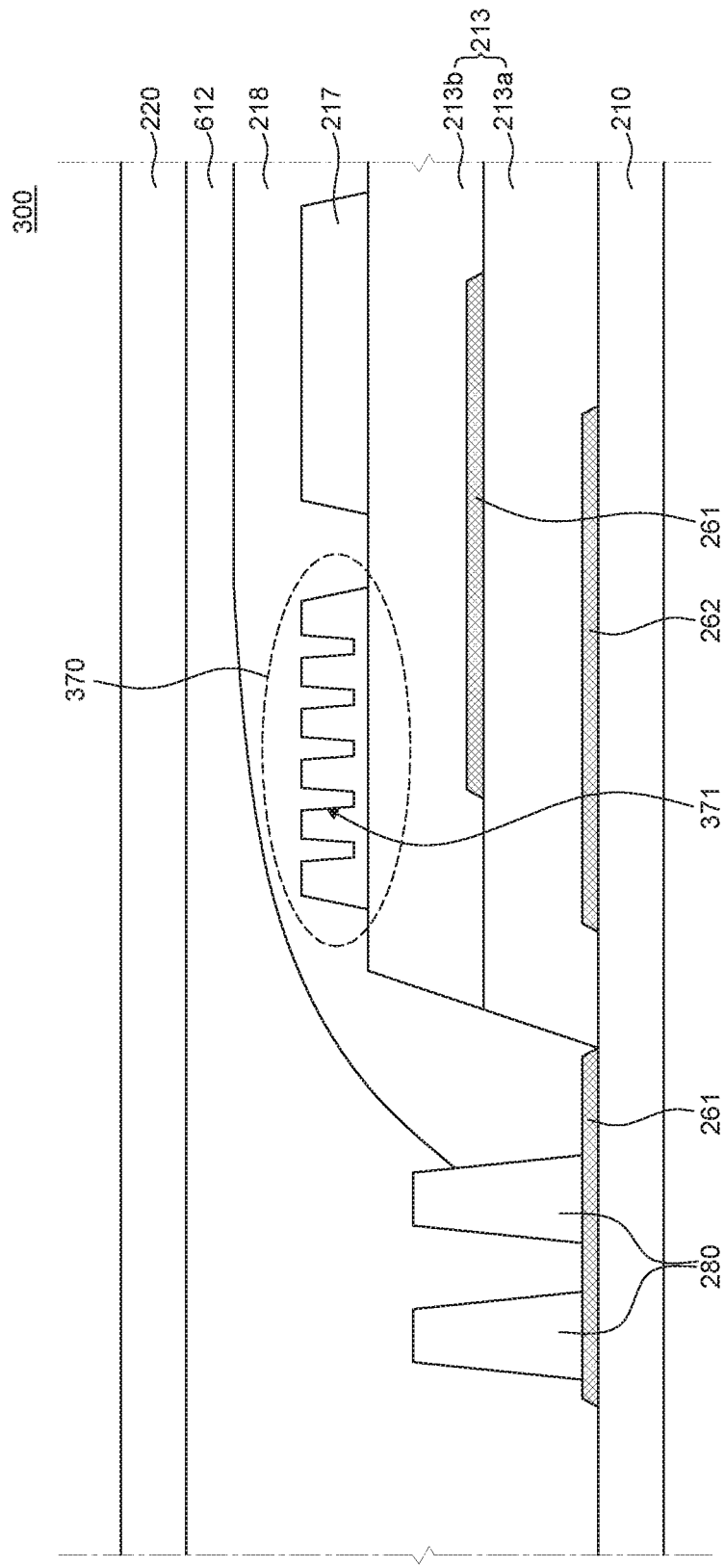
FIGS. 3A to 3C are schematic cross-sectional views for describing a part of a bezel area for describing various configurations of a flow control pattern according to another exemplary embodiment of the present disclosure.
Figure 3B:
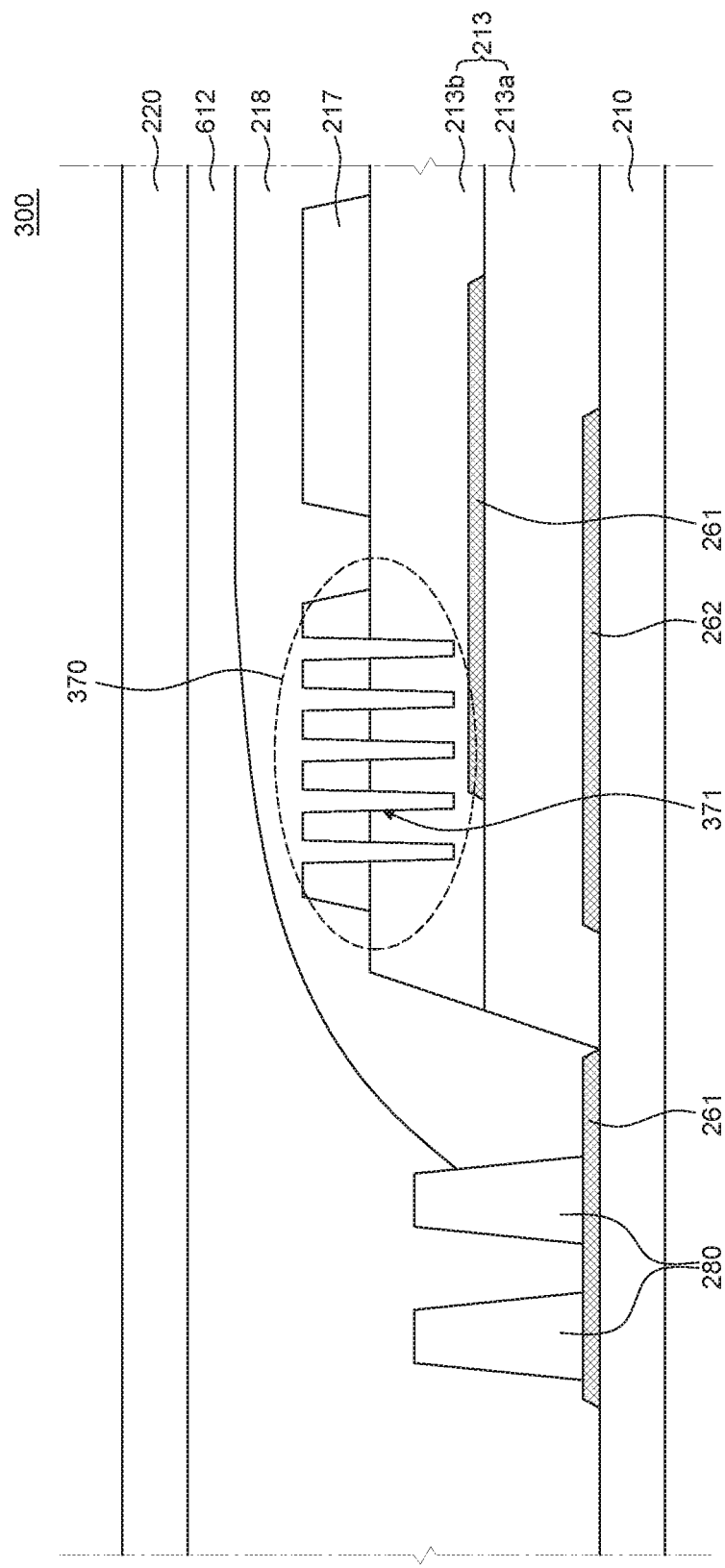
Figure 3C:
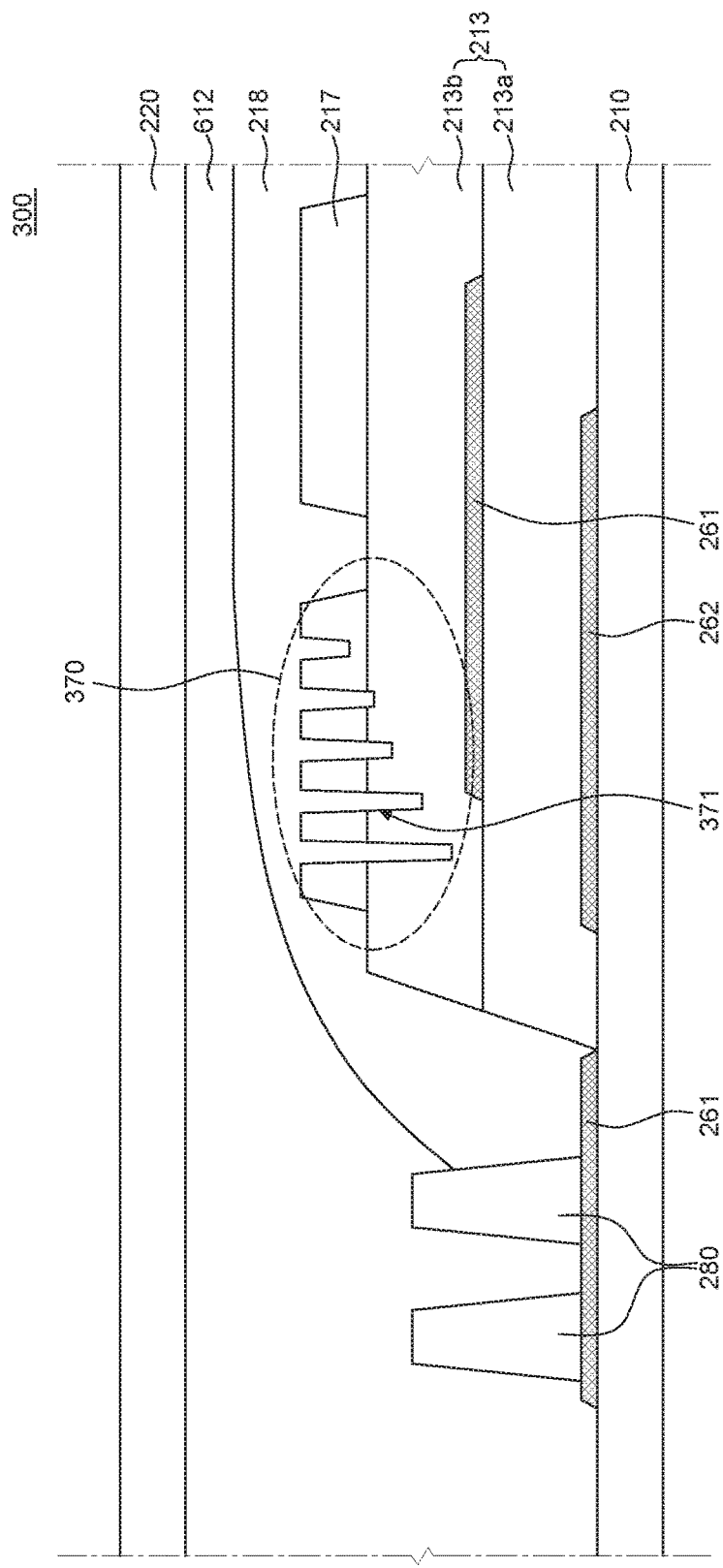

FIGS. 3A to 3C are schematic cross-sectional views for describing a part of a bezel area for describing various configurations of a flow control pattern according to another exemplary embodiment of the present disclosure.

Among respective constituent elements illustrated in FIGS. 3A to 3C, like constituent elements as in FIGS. 2A to 2C designate like reference numerals and the duplicated description will be omitted.

The bezel area 240 illustrated in FIGS. 3A to 3C may be located outside the active area 230, and a driving circuit (for example, GIP), a power supply line, and the like may be disposed thereon. Further, a structure for discharging remaining gas may be located in the bezel area 240.

A power line, a signal line, and the like disposed in the bezel area 240 may be wiring electrodes illustrated in FIG. 3 and may be formed by the same process with the same material as those used in the gate electrode 262 or the source/drain electrode 261 illustrated in FIGS. 2A to 2C.

In the exemplary embodiment, the planarization layer 213 may be configured by two layers including a first planarization layer 213a and a second planarization layer 213b. This is to accommodate a more complicated line structure implemented for a higher-resolution screen, as described above.

Hereinafter, the organic light emitting diode display having a flow control pattern 370 will be described with reference to FIG. 3A. The substrate 210 may further include a multi buffer layer or a passivation layer, and a driving element and the like may be disposed. On the substrate 210, the bank layer 217 is disposed on the planarization layer 213 and the protective layer 218 is disposed.

A dam structure 280 may be disposed to control the flow of the protective layer 218. A plurality of dam structures 280 may be disposed, but only one dam structure 280 may be desirable in achieving a narrow bezel configuration. Further, the dam structure 280 may be formed by using the material(s) used for creating the planarization layer 213, the bank layer 217, and the like.

The flow control pattern 370 may be configured to have at least one hole 371 or opening. Referring to FIG. 3A, the flow control pattern 370 having at least one hole 371 is disposed in a layer that includes the bank layer 217, and/or in the layer that includes the planarization layer 213. Further, a hole 371 in the flow control pattern 370 may extend from the bank layer 217 to the planarization layer 213.

For the flow control pattern 370, in order to control the flow of the protective layer 218, the number, the area, and the depth of the at least one hole 371 in the flow control pattern 370 may be determined by considering the flow characteristics of the protective layer 218 in a non-cured (initial liquid) state.

Further, the number, the area, and the depth of the at least one hole 371 in the flow control pattern 370 may be changed according to a use of the organic light emitting diode display by considering a case where the flow of the protective layer 218 needs to be further controlled.

The flow control pattern 370 can be configured by at least one hole 371 in the layer that includes the bank layer 217 or the layer that includes the planarization layer 213 and surface energy of the interface is increased due to an increase of the contact area with the protective layer 218 while the protective layer 218 is at the non-cured state. As a result, the flow of the protective layer 218 is stopped outside of the area with the flow control pattern 370. Accordingly, it is possible to minimize or reduce the size the bezel area.

In the flow control pattern 370, a design for a required area of the bezel area varies according to a use of the display device, and thus as described above, the number, the area, and the depth of the at least one hole 371 in the flow control pattern 370 may be determined according to the use of the display device and the flow of the protective layer 218.

As illustrated in FIGS. 3B and 3C, in order to control the depth of the hole 371 configuring the flow control pattern 370, a hole 371 having a structure extending to at least one layer configuring the planarization layer 213 may be disposed.

Further, as illustrated in FIG. 3C, a plurality of holes 371 having different depths may be disposed, and in order to more efficiently control the flow of the protective layer 218, the hole 371 positioned at the outside of the display device may have a depth larger than that of the hole 371 positioned at the inside thereof.

In order to control the flow of the protective layer 218, the depth, the area, and the number of the holes 371 can be decided upon, and in order to further control the flow of the protective layer 218, the outside and the inside of the display device have holes 371 of different depths and/or different areas to configure the flow control pattern 370 capable of more efficiently controlling the flow of the protective layer.

FIGS. 4A to 4D are schematic plan views for describing various pattern shapes of the flow control pattern according to one embodiment.

As described above, the hole 371 provides a function of controlling the flow and the protective layer 218 may be more efficiently disposed in a desired area by inducing a direction of the flow as well as controlling the flow of the material for forming the protective layer 218.

Figure 4A:
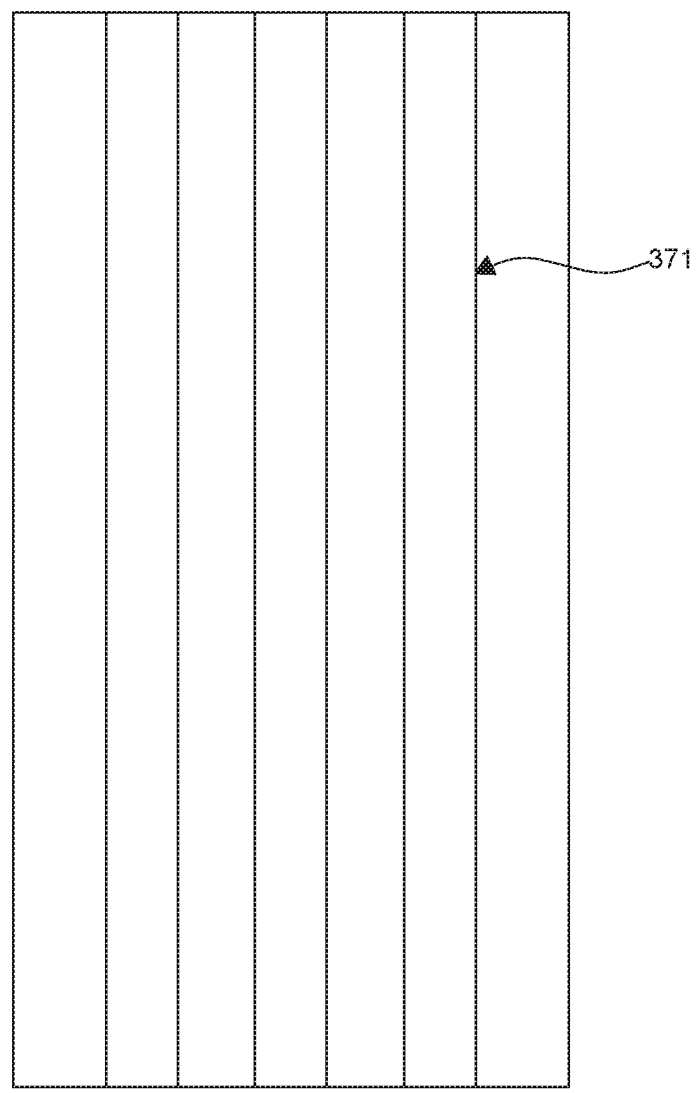
FIGS. 4A to 4D are schematic plan views for describing various pattern shapes of the flow control pattern.

Referring to FIG. 4A, the holes 371 are disposed in a straight direction to control the flow of the protective layer to suppress the protective layer from excessively flowing in a direction which forms an angle of 90° with a straight direction.

Figure 4B:
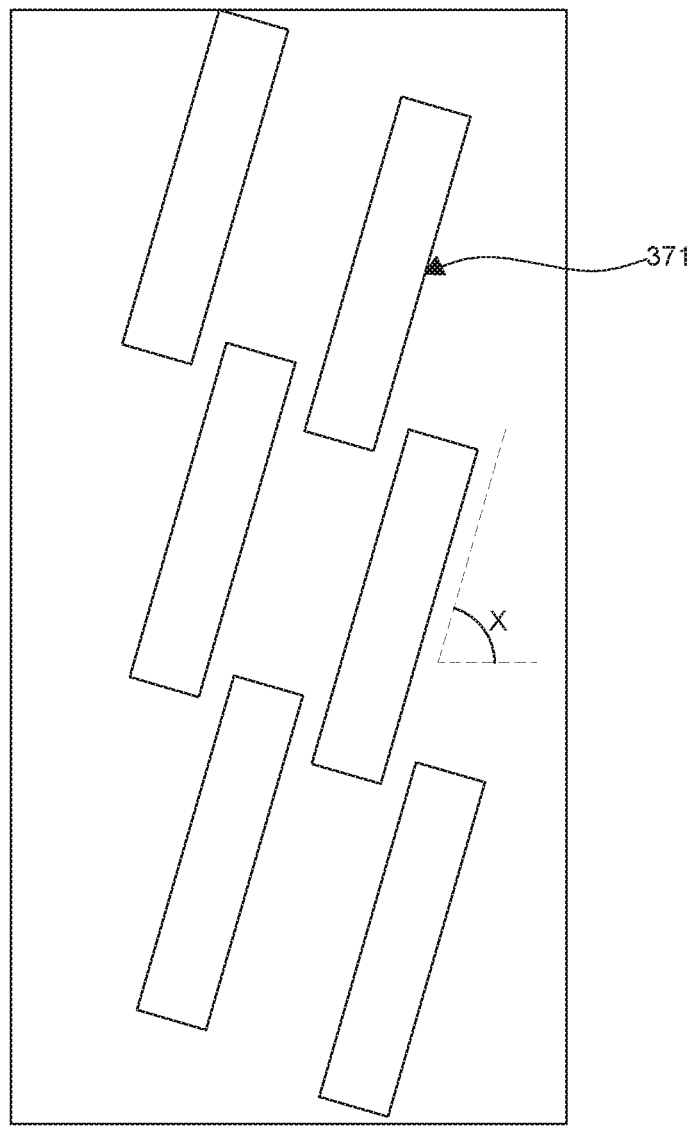

Referring to FIG. 4B, the holes 371 are disposed to have a slope x to induce the flow of the protective layer in a particular direction. The slope x may be controlled to be within a range of 85° to 45° according to the flow degree of the protective layer to be controlled and the disposed process features.

Figure 4C:
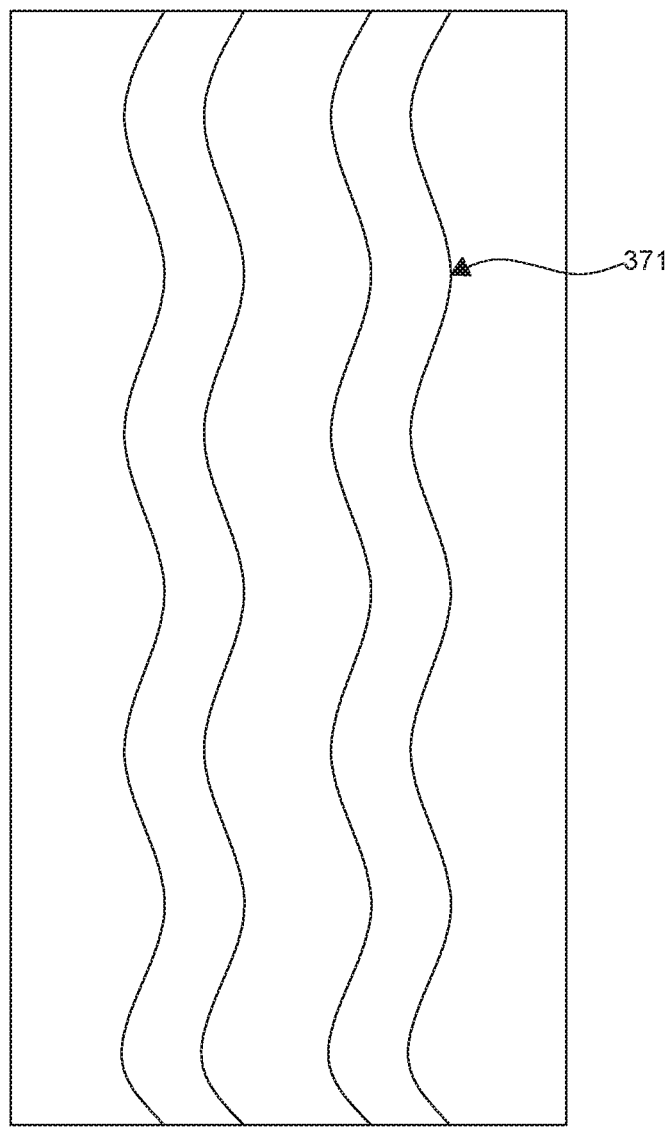

Referring to FIG. 4C, the holes 371 are disposed to have a streamlined or curved pattern instead of the straight direction to further efficiently control the flow of the protective layer.

Figure 4D:
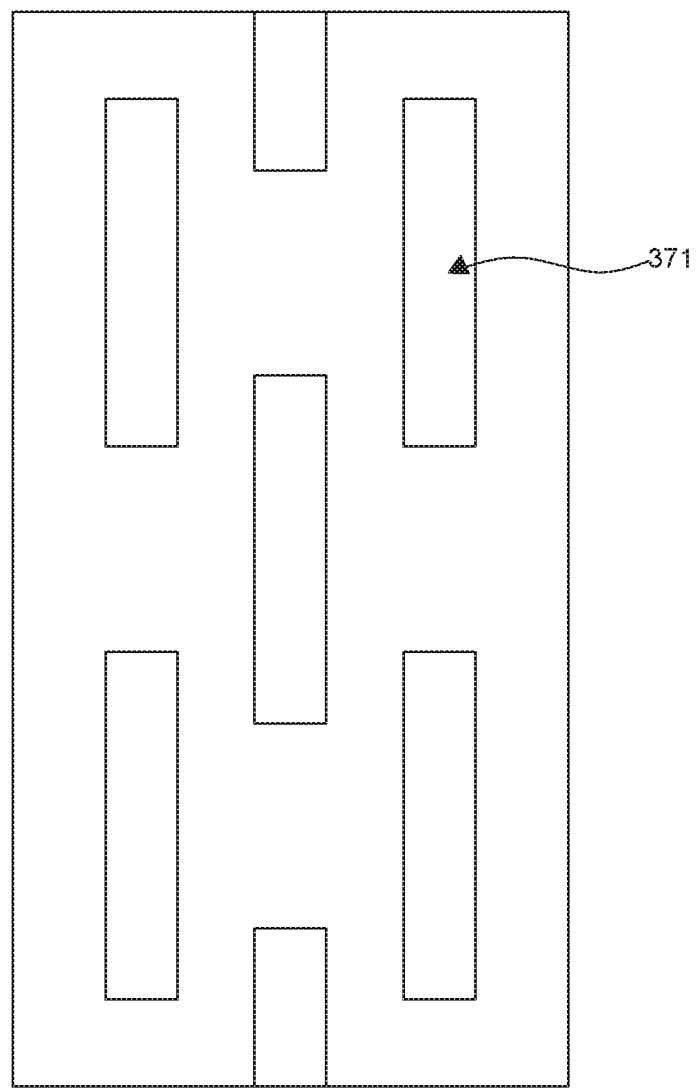

Referring to FIG. 4D, the holes 371 may be disposed discontinuously and disposed to have various patterns by considering an effect between other constituent elements of the display device.

As described above, the holes 371 configuring the flow control pattern 370 may be disposed by controlling the control force of the flow by controlling the number, the depth, and the area thereof and using various methods including forming various patterns, straight lines, curves, and slopes of the holes 370 and may be disposed by a configuration mixed with these various patterns.

The exemplary embodiments of the present disclosure can also be described as follows:

According to an aspect of the present disclosure, there is provided an organic light emitting diode display, comprising: a substrate including an active area that displays an image and a bezel area that does not display the image; an organic light emitting element over the substrate; a protective layer over the substrate that protects the organic light emitting element, the protective layer made of a curable organic material; a planarization layer below the protective layer and the organic light emitting element, the planarization layer including a concave portion that controls a flow of the protective layer in a non-cured state from the active area into the bezel area during a manufacturing process of disposing the protective layer over the substrate.

The concave portion may comprise at least one a hole in the planarization layer.

The concave portion may be disposed in either the active area or the bezel area.

The organic light emitting diode display may further comprise one or more dam structures located at one side of the concave portion in the planarization layer.

The dam structure may comprise a first layer on the planarization layer and a second layer on the first layer.

At least a portion of an inner surface of the concave portion of the planarization layer is covered by an anode electrode, the anode electrode protecting the concave portion from damage during manufacturing of the organic light emitting diode display and preventing out gassing that damages the organic light emitting element.

According to another aspect of the present disclosure, there is provided an organic light emitting diode display, comprising: a substrate including an active area that displays an image and a bezel area that does not display an image; an organic light emitting element over the substrate; a protective layer over the substrate that covers the organic light emitting element; a plurality of planarization layers below the organic light emitting element; a bank on the second planarization layer; a flow control pattern on the second planarization layer and adjacent to the bank, the flow control pattern comprising at least one concave portion that controls a flow of the protective layer from the active area into the bezel area.

The flow control pattern may be in the active area or in the bezel area.

The concave portion may be extended into at least one of the plurality of planarization layers.

The flow control pattern may include a plurality of concave portions comprising a first concave portion and a second concave portion, wherein the first concave portion and the second concave portion extend into at least one of the plurality of planarization layers at different depths.

The plurality of convace portions of the flow control pattern may be disposed in order of increasing depth towards an outer edge of the organic light emitting diode display.

According to yet another aspect of the present disclosure, there is provided an organic light emitting diode display comprising: a substrate including an active area that displays an image and a bezel area that does not display the image, the bezel area adjacent to the active area; a plurality of driving elements on the substrate; a plurality of planarization layers covering the plurality of driving elements, the plurality of planarization layers including a first planarization layer and a second planarization layer on the first planarization layer; a bank layer on the second planarization layer; an organic light emitting element including an organic light emitting layer on the bank layer; and a protective layer covering the organic light emitting element, wherein at least one of the plurality of planarization layers and the bank layer includes a flow control pattern having a plurality of concave portions that control a flow of the protective layer from the active area into the bezel area during a manufacturing process of the organic light emitting diode display.

The flow control pattern may be disposed in either the active area or the bezel area.

At least two of the plurality of concave portions of the flow control pattern have different depths.

The plurality of concave portions of the flow control pattern may be disposed in order of increasing depth in a direction from the active area towards the bezel area.

The plurality of concave portions may extend into at least one of the plurality of planarization layers.

According to yet another aspect of the present disclosure, there is provided an organic light emitting diode display, comprising: a substrate including an active area that displays an image and a bezel area that does not display the image; an organic light emitting element over the substrate; and a protective layer over the substrate that protects the organic light emitting element, the protective layer sloping downward from the active area towards the bezel area.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. An organic light emitting diode display, comprising:
    a substrate including an active area that displays an image and a bezel area that does not display an image;
    an organic light emitting element over the substrate;
    a thin-film transistor electrically connected to the organic light emitting element, the thin-film transistor including a gate electrode, a source electrode, and a drain electrode;
    a protective layer over the substrate that covers the organic light emitting element;
    a plurality of planarization layers below the organic light emitting element, the plurality of planarization layers including a first planarization layer and a second planarization layer on the first planarization layer, wherein the second planarization layer is further away from the substrate than the first planarization layer;
    a bank on the second planarization layer;
    a flow control pattern on the second planarization layer, adjacent to the bank, and overlapping at least the gate electrode of the thin-film transistor, the flow control pattern comprising at least one concave portion that controls a flow of the protective layer from the active area into the bezel area.

2. The organic light emitting diode display according to claim 1, wherein the flow control pattern is in the active area.

3. The organic light emitting diode display according to claim 1, wherein the concave portion extends into at least one of the plurality of planarization layers.

4. The organic light emitting diode display according to claim 3, wherein the flow control pattern includes a plurality of concave portions comprising a first concave portion and a second concave portion, wherein the first concave portion and the second concave portion extend into at least one of the plurality of planarization layers at different depths.

5. The organic light emitting diode display according to claim 4, wherein the plurality of concave portions of the flow control pattern are disposed in order of increasing depth towards an outer edge of the organic light emitting diode display.

6. The organic light emitting diode display according to claim 1, further comprising:
    a plurality of dam structures disposed partially in the bezel area and a periphery of the active area.

7. An organic light emitting diode display, comprising:
    a substrate including an active area that displays an image and a bezel area that does not display the image, the bezel area adjacent to the active area;
    a plurality of driving elements on the substrate, each of the plurality of driving elements including a gate electrode, a source electrode, and a drain electrode;
    a plurality of planarization layers covering the plurality of driving elements, the plurality of planarization layers including a first planarization layer and a second planarization layer on the first planarization layer, wherein the second planarization layer is further away from the substrate than the first planarization layer;
    a bank layer on the second planarization layer;
    an organic light emitting element including an organic light emitting layer on the bank layer; and
    a protective layer covering the organic light emitting element,
    wherein at least one of the second planarization layer and the bank layer includes a flow control pattern having a plurality of concave portions that control a flow of the protective layer from the active area into the bezel area during a manufacturing process of the organic light emitting diode display, the flow control pattern overlapping at least the gate electrode of one of the plurality of driving elements.

8. The organic light emitting diode display according to claim 7, wherein the flow control pattern is disposed in the active area.

9. The organic light emitting diode display according to claim 7, wherein at least two of the plurality of concave portions of the flow control pattern have different depths.

10. The organic light emitting diode display according to claim 9, wherein the plurality of concave portions of the flow control pattern are disposed in order of increasing depth in a direction from the active area towards the bezel area.

11. The organic light emitting diode display according to claim 7, wherein the plurality of concave portions extend into at least one of the plurality of planarization layers.

12. The organic light emitting diode display according to claim 7, further comprising:
a plurality of dam structures disposed partially in the bezel area and a periphery of the active area.

13. An organic light emitting diode display, comprising:
a substrate including an active area that displays an image and a bezel area that does not display an image;
a thin-film transistor over the substrate, the thin-film transistor including a gate electrode, a source electrode, and a drain electrode;
an organic light emitting element over the substrate and electrically connected to the thin-film transistor;
a protective layer over the substrate that covers the organic light emitting element;
a plurality of planarization layers below the organic light emitting element, the plurality of planarization layers including a first planarization layer and a second planarization layer;
a bank on the second planarization layer;
a flow control pattern on the second planarization layer, adjacent to the bank, and at least partially overlapping at least the gate electrode of the thin-film transistor, the flow control pattern comprising at least one concave portion that controls a flow of the protective layer from the active area into the bezel area.

14. The organic light emitting diode display according to claim 13, wherein the flow control pattern is in the active area.

15. The organic light emitting diode display according to claim 13, wherein the concave portion extends into at least one of the plurality of planarization layers.

16. The organic light emitting diode display according to claim 15, wherein the flow control pattern includes a plurality of concave portions comprising a first concave portion and a second concave portion, wherein the first concave portion and the second concave portion extend into at least one of the plurality of planarization layers at different depths.

17. The organic light emitting diode display according to claim 16, wherein the plurality of concave portions of the flow control pattern are disposed in order of increasing depth towards an outer edge of the organic light emitting diode display.

18. The organic light emitting diode display according to claim 13, further comprising:
a plurality of dam structures disposed partially in the bezel area and a periphery of the active area.

* * * * *